(12) United States Patent
Harada et al.

(10) Patent No.: US 9,791,873 B2
(45) Date of Patent: Oct. 17, 2017

(54) SEMICONDUCTOR INTEGRATED CIRCUIT DEVICE AND METHOD OF REGULATING OUTPUT VOLTAGE THEREOF

(71) Applicant: SEIKO INSTRUMENTS INC., Chiba-shi, Chiba (JP)

(72) Inventors: Hirofumi Harada, Chiba (JP); Shinjiro Kato, Chiba (JP)

(73) Assignee: SII Semiconductor Corporation (JP)

( * ) Notice: Subject to any disclaimer, the term of this patent is extended or adjusted under 35 U.S.C. 154(b) by 0 days.

(21) Appl. No.: 14/805,550

(22) Filed: Jul. 22, 2015

(65) Prior Publication Data

US 2016/0033981 A1  Feb. 4, 2016

(30) Foreign Application Priority Data

Jul. 31, 2014 (JP) ................... 2014-156502

(51) Int. Cl.
*H02M 3/156* (2006.01)
*H02M 1/00* (2006.01)
*G05F 1/46* (2006.01)

(52) U.S. Cl.
CPC ................... *G05F 1/468* (2013.01)

(58) Field of Classification Search
CPC ......... H02M 2001/0045; H02M 3/156; H02M 2003/1566
USPC ....................................................... 323/265
See application file for complete search history.

(56) References Cited

U.S. PATENT DOCUMENTS

| | | | | |
|---|---|---|---|---|
| 5,563,546 A * | 10/1996 | Tsukada | ................. | G11C 5/147 327/407 |
| 5,808,954 A * | 9/1998 | Ichikawa | .............. | G11C 11/418 327/535 |
| 6,195,289 B1 * | 2/2001 | Pasotti | ................ | G11C 11/5621 365/185.03 |
| 9,411,345 B2 * | 8/2016 | Utsunomiya | ............. | G05F 1/46 |
| 2002/0139999 A1 * | 10/2002 | Hirano | ................... | G11C 16/16 257/200 |
| 2005/0057969 A1 * | 3/2005 | Nitta | ...................... | G11C 16/10 365/185.22 |

(Continued)

OTHER PUBLICATIONS

Abstract, Publication No. 2008-198775, Publication Date Aug. 28, 2008.

*Primary Examiner* — Adolf Berhane
*Assistant Examiner* — Sisay G Tiku
(74) *Attorney, Agent, or Firm* — Adams & Wilks

(57) ABSTRACT

A semiconductor integrated circuit device includes a PMOS output element having a source electrode connected to a power supply terminal and a drain electrode connected to an output voltage terminal from which an output voltage is supplied. A voltage dividing circuit has resistors for dividing the supplied output voltage to produce a divided voltage. A reference voltage circuit generates a reference voltage and has a memory element whose threshold voltage determines the reference voltage. The reference voltage circuit has a regulating input terminal connected to the memory element to change the threshold voltage of the memory element. An error amplifier is supplied with the divided voltage and the reference voltage to generate a voltage that is applied to a gate electrode of the PMOS output element. The voltage is amplified depending on a difference between the divided voltage and the reference voltage.

6 Claims, 10 Drawing Sheets

(56) References Cited

U.S. PATENT DOCUMENTS

| | | | |
|---|---|---|---|
| 2005/0281126 A1* | 12/2005 | Kato | B82Y 10/00 365/232 |
| 2007/0030731 A1* | 2/2007 | Honda | G11C 16/28 365/185.2 |
| 2007/0252623 A1* | 11/2007 | Zampaglione | G11C 5/147 327/74 |
| 2009/0190407 A1* | 7/2009 | Satou | G11C 29/50 365/185.21 |
| 2010/0097128 A1* | 4/2010 | Sumita | G05F 3/205 327/537 |
| 2012/0013396 A1* | 1/2012 | Morino | G05F 3/24 327/540 |
| 2014/0167839 A1* | 6/2014 | Kwon | G05F 1/613 327/543 |
| 2014/0266118 A1* | 9/2014 | Chern | H02M 3/156 323/283 |
| 2014/0286091 A1* | 9/2014 | Uemura | G11C 16/30 365/185.2 |

* cited by examiner

SEMICONDUCTOR INTEGRATED CIRCUIT DEVICE AND METHOD OF REGULATING OUTPUT VOLTAGE THEREOF

BACKGROUND OF THE INVENTION

1. Field of the Invention

The present invention relates to a semiconductor integrated circuit device having a function of outputting a constant voltage and a function of detecting a constant voltage, and a method of regulating an output voltage thereof.

2. Description of the Related Art

An electric circuit used in electrical equipment is driven by an external power supply such as a battery. When a voltage value of the external power supply fluctuates, malfunction of the electric circuit and various abnormal phenomena may be caused, and thus, it is a typical approach to place a power management IC between the electric circuit and the external power supply, for regulating the external power supply so that a constant voltage is output or monitoring fluctuations of the power supply, to thereby promote stable operation. In particular, in a semiconductor integrated circuit such as a microcomputer or a CPU that is operated at increasingly lower voltages in recent years, the power management IC has been strongly required to output an accurate constant voltage and to accurately monitor the voltage value.

Exemplary power management ICs for outputting a constant voltage from an external power supply to an electric circuit include a step-down series regulator as illustrated in FIG. 3.

In this semiconductor integrated circuit, an external power supply voltage that is applied between a ground terminal 105 and a power supply terminal 106 is divided by a PMOS output element 104 and a voltage dividing circuit 103 including resistance elements 102. The voltage divided by the resistance elements 102 is input to a minus input terminal of an error amplifier 101, and is compared to a certain reference voltage value generated by a reference voltage circuit 100. Depending on a result of the comparison, the error amplifier 101 controls an input voltage of the PMOS output element 104 to change a source-drain resistance of the PMOS output element 104. As a result, the output terminal 107 has the function of outputting a constant output voltage that does not depend on the power supply voltage, but depends on the reference voltage value of the reference voltage circuit 100 and a resistance divided voltage ratio of the voltage dividing circuit 103. The output voltage is calculated by the following Expression (1):

(output voltage)=(reference voltage value)×(resistance divided voltage ratio of voltage dividing circuit) (1)

In regulating the output voltage, by changing a resistance value of the resistance element 102 in a method described below, the divided voltage ratio of the voltage dividing circuit 103 is changed to set the output voltage value at a desired value based on Expression (1). Therefore, the voltage dividing circuit of the semiconductor integrated circuit is required to be processed/corrected for each target output voltage.

Further, a voltage detector as illustrated in FIG. 4 that has the function of outputting a signal when the power supply voltage becomes a constant voltage is also one kind of the power management IC.

In this semiconductor integrated circuit, the power supply voltage that is input from the power supply terminal 106 is converted to a voltage divided by the voltage dividing circuit 103 that includes the resistance elements 102, and the converted voltage is compared to the reference voltage value of the reference voltage circuit 100 by a comparator 108. A voltage signal corresponding to a result of the comparison is output from the output terminal 107. With this mechanism, a voltage detector is realized that has the function of monitoring the power supply voltage and outputting, when the voltage becomes equal to or higher than, or, equal to or lower than a certain voltage, a signal for the purpose of performing appropriate processing.

Also, in the example illustrated in FIG. 4, by changing the resistance element 102, the divided voltage ratio of the voltage dividing circuit 103 is changed to set a desired voltage detection value based on Expression (1). Therefore, the voltage dividing circuit of the semiconductor integrated circuit is required to be processed/corrected for each target output voltage.

As the resistance element described above that is used for a voltage dividing circuit of a semiconductor integrated circuit, a diffused resistor that is a monocrystalline silicon semiconductor substrate implanted with impurities having a conductivity type opposite to that of the semiconductor substrate, a resistor formed of polycrystalline silicon implanted with impurities, or the like is used. In designing the voltage dividing circuit, when a plurality of such resistors is used, the resistors are set to have the same length, the same width, and the same resistivity. Then, the respective resistance elements are equally subjected to variations in shape in an etching process in which the shape is determined and to variations in impurity implantation. Therefore, even if the absolute values of the resistance elements vary, resistance ratios between the resistance elements can be maintained at a constant value.

When the resistance elements having a certain resistance value based on the same shape and the same resistivity are used in a voltage dividing circuit, various resistance values are realized through series connection and parallel connection of unit resistance elements 200 such as resistor groups 201 to 204 in FIG. 5. As described above, the unit resistance elements 200 are resistance elements having the same shape and the same resistivity, and thus, the high resistance ratios between the resistor groups each including the unit resistance element(s) can be maintained with high accuracy.

Further, fuses 301 to 304 of, for example, polycrystalline silicon, are formed in parallel with the resistor groups 201 to 204, respectively, so as to be cut by laser radiation from the outside. Depending on whether or not the fuses are cut by the laser radiation, a resistance value between a terminal 109 and a terminal 110 can be changed as necessary. Then, a voltage corresponding to a divided voltage ratio to a fixed resistor formed between the terminal 110 and a terminal 111 is output from the terminal 110.

In the voltage dividing circuit as described above that has a highly accurate resistance ratio, by cutting the polycrystalline silicon fuse(s) with a laser, a desired divided voltage ratio can be obtained with high accuracy, and products having various target output voltages can be manufactured using the same semiconductor integrated circuit.

A typical method of regulating an output voltage is as illustrated in FIG. 2.

First, an output voltage of a product completed in a semiconductor processing factory is measured as it is ((1) in FIG. 2). Then, based on a computational expression or a database prepared in advance depending on the output voltage, the polycrystalline silicon fuses formed in the voltage dividing circuit are processed with a laser to trim the output voltage ((2) in FIG. 2). Finally, the output voltage of the processed product is measured again to see whether or not the product is within specification as desired ((3) in FIG. 2). If the product is out of specification, the product is not shipped. Other than this, there is an online trimming method in which the resistors are gradually processed while the output voltage is monitored, and the processing is stopped when the output voltage reaches a desired value. The method illustrated in FIG. 2 is called an offline trimming method in contrast with the online trimming method.

Next, a reference voltage circuit that is used similarly in the circuits illustrated in FIG. 3 and FIG. 4 is described with reference to FIG. 6A and FIG. 6B.

A most basic related-art reference voltage circuit includes a depression (depletion) type NMOS transistor 402 and an enhancement type NMOS transistor 401. As illustrated in FIG. 6A, each of the transistors is formed on a P-type well region 5 in a semiconductor substrate 1, and includes a gate electrode 6, a gate oxide film 9, and an N-type source/drain region 12. The transistors are different from each other in that, as an impurity region for determining a threshold voltage that is formed under the gate oxide film 9, an N-channel impurity region 10 is formed with regard to the depression type NMOS transistor 402 while a P-channel impurity region 11 is formed with regard to the enhancement type NMOS transistor 403. Further, each of the transistors includes a drain terminal 2 and a source terminal 3 for controlling operation thereof, and a body terminal 4 for fixing a potential of the P-type well region.

By connecting in series the depression type NMOS transistor 402 and the enhancement type NMOS transistor 401 between a power supply terminal 403 and a ground terminal 404 as illustrated in FIG. 6B, outputting a constant current from the depression type NMOS transistor 402 as a current source, and inputting the current to the drain terminal 2 of the enhancement type NMOS transistor 401 as a load element, a voltage generated at the drain terminal of the enhancement type NMOS transistor 401 that is a constant voltage is output to a reference voltage output terminal 405 (see, for example, Japanese Patent Application Laid-open No. 2008-198775).

The related-art method of regulating an output voltage of a semiconductor integrated circuit device has the following problems.

With regard to the offline trimming method,
1) measurement is required to be performed twice and processing is required to be performed once, which delays completion of the product to hinder rapid shipment of the product,
2) investment in equipment for the processing and the measurement is huge,
3) reregulation of a product which turns out to be out of specification after the measurement in (3) in FIG. 2 is difficult, and thus, it is difficult to inhibit lowering of a yield, and the like.

In particular, with regard to 3) above, the offline trimming method formulates a computational expression and constructs a database for the regulation on the assumption that voltage division using resistors is ideally performed. However, in manufacturing a semiconductor integrated circuit, due to manufacture fluctuations, although not so much as an absolute value of a resistance value, a resistance divided voltage ratio also fluctuates, and the possibility of manufacturing an out-of-specification product cannot be reduced to zero.

Further, in this offline trimming method, a plurality of resistance elements and a plurality of fuses for the trim are necessary, and increase in product chip size is inevitable. As described above, when a more highly accurate resistance divided voltage ratio is quested, it is necessary to increase the size and the number of the resistance elements, and thus, as the specifications become stricter, the extent of increase in cost tends to become larger.

Further, the online trimming method has a fundamental problem in that, due to instability of the resistance value, it is difficult to obtain a highly accurate output voltage. This is because resistance elements to which a laser is radiated during laser processing generate heat, and thus, when the resistance elements depend on temperature, the resistance value changes accordingly, or, recrystallization of the resistance elements after the laser radiation or the like shifts the resistance value.

SUMMARY OF THE INVENTION

According to one embodiment of the present invention, in order to solve the problems described above, there is provided a semiconductor integrated circuit device, including: a regulating input terminal; an output voltage terminal; a memory element having a threshold voltage that is changed through application thereto of a voltage and a current from the regulating input terminal, in which an output voltage from the output voltage terminal is changeable depending on an amount of change of the threshold voltage of the memory element.

Further, there is provided a semiconductor integrated circuit device, including: a reference voltage circuit including a memory element that includes a regulating input terminal, in which a reference voltage that is output from the reference voltage circuit is changed depending on an amount of change of a threshold voltage of the memory element, and an output voltage is changeable depending on an amount of change of the reference voltage.

Further, there is provided a semiconductor integrated circuit device, including: a reference voltage circuit including a memory element that includes a regulating input terminal; an error amplifier; a PMOS output element; and a voltage dividing circuit including resistors, in which a source electrode of the PMOS output element is connected to a power supply terminal, a drain electrode of the PMOS output element is connected to an output voltage terminal, an output voltage that is output from the output voltage terminal is divided by the voltage dividing circuit, the divided voltage and a reference voltage that is output from the reference voltage circuit are input to the error amplifier, the input voltages are compared to each other, and the error amplifier outputs a voltage amplified depending on a difference between the compared input voltages to be input to a gate electrode of the PMOS output element.

Alternatively, there is provide a semiconductor integrated circuit device, including: a reference voltage circuit including a memory element that includes a regulating input terminal; a comparator; and a voltage dividing circuit including resistors, in which a power supply voltage that is input from a power supply terminal is divided by the voltage dividing circuit, the divided voltage and a reference voltage that is output from the reference voltage circuit are input to the comparator, the input voltages are compared to each other, and a signal corresponding to a difference between the input voltages is sent from the output voltage terminal.

On the other hand, in the semiconductor integrated circuit device, the memory element is an N-channel MOS transistor including a floating gate electrode and a control gate electrode.

Further, in the semiconductor integrated circuit device, the reference voltage circuit includes a memory element as an N-channel depression type MOS transistor including a floating gate electrode and a control gate electrode, and an N-channel enhancement type MOS transistor.

Then, there is provided a method of regulating an output voltage, including: monitoring the output voltage while a voltage and a current are input to a memory element via a regulating input terminal; and stopping, when the output voltage is within specification, the voltage and the current that are input via the regulating input terminal, to thereby arbitrarily set the output voltage.

According to the one embodiment of the present invention, a chip size of the semiconductor integrated circuit device can be reduced, and, at the same time, the method of regulating the output voltage can be simplified. Further, the output voltage becomes more accurate, and thus, improvement in yield can be expected.

DETAILED DESCRIPTION OF THE INVENTION

An embodiment of the present invention is described with reference to the attached drawings.

Figure 3:
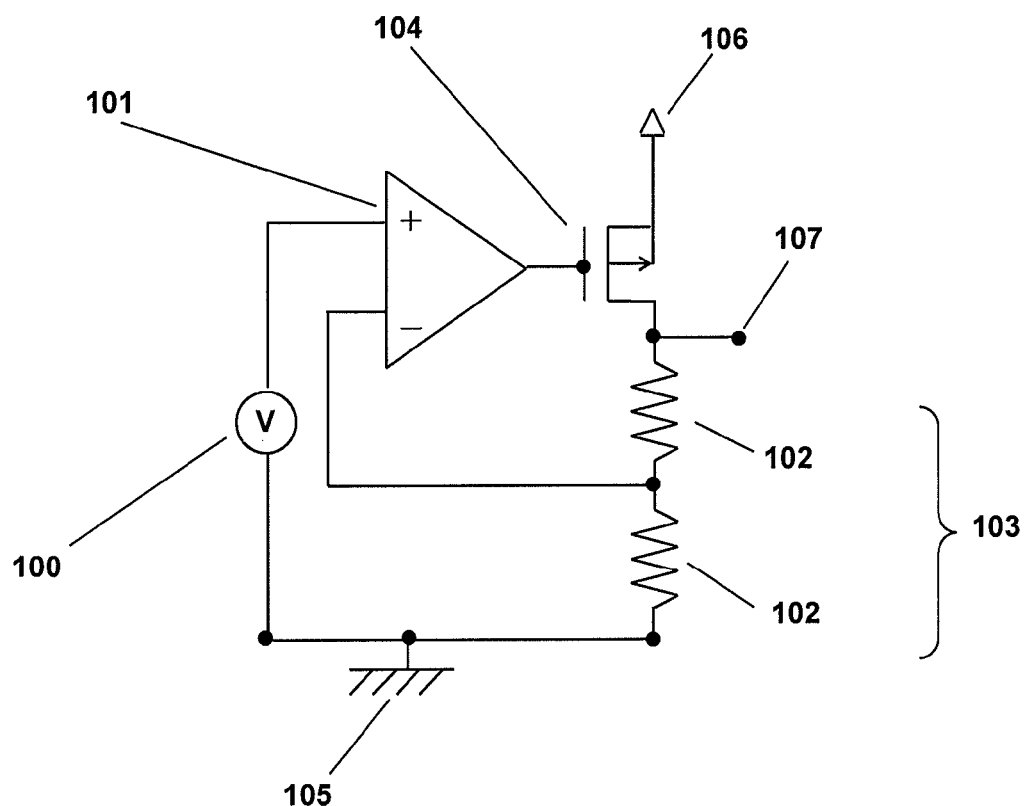
FIG. 3 is a schematic circuit diagram of a step-down series regulator of a related-art semiconductor integrated circuit device.
Figure 4:
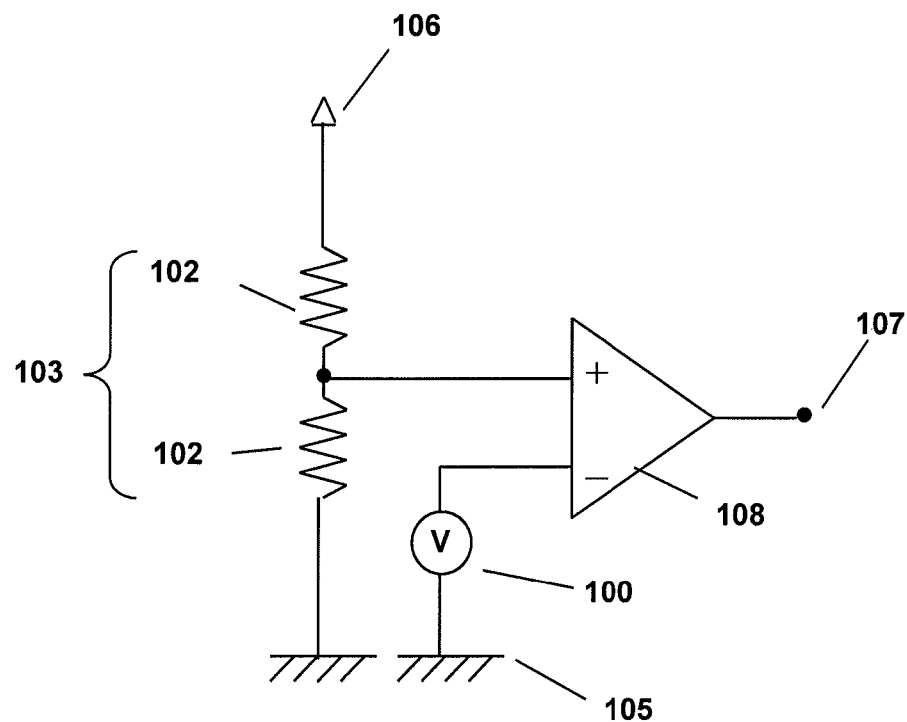
FIG. 4 is a schematic circuit diagram of a voltage detector of a related-art semiconductor integrated circuit device.
Figure 5:
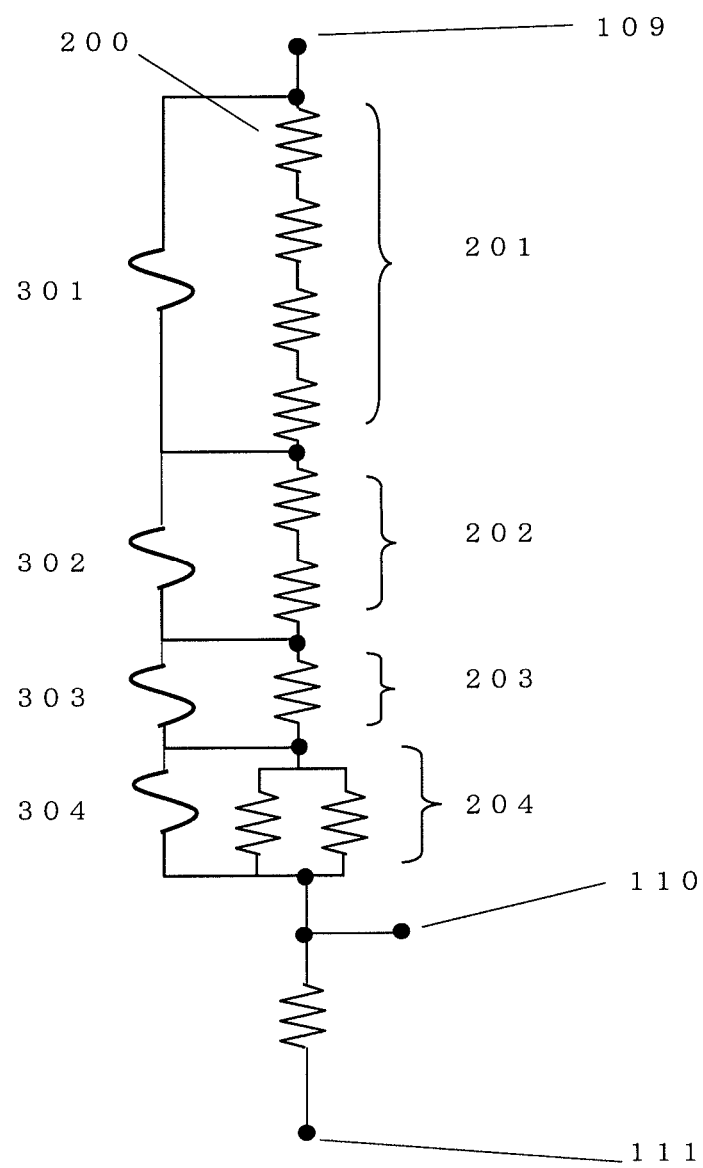
FIG. 5 is an illustration of an exemplary voltage dividing circuit in which related-art resistance elements are combined.
Figure 6A:
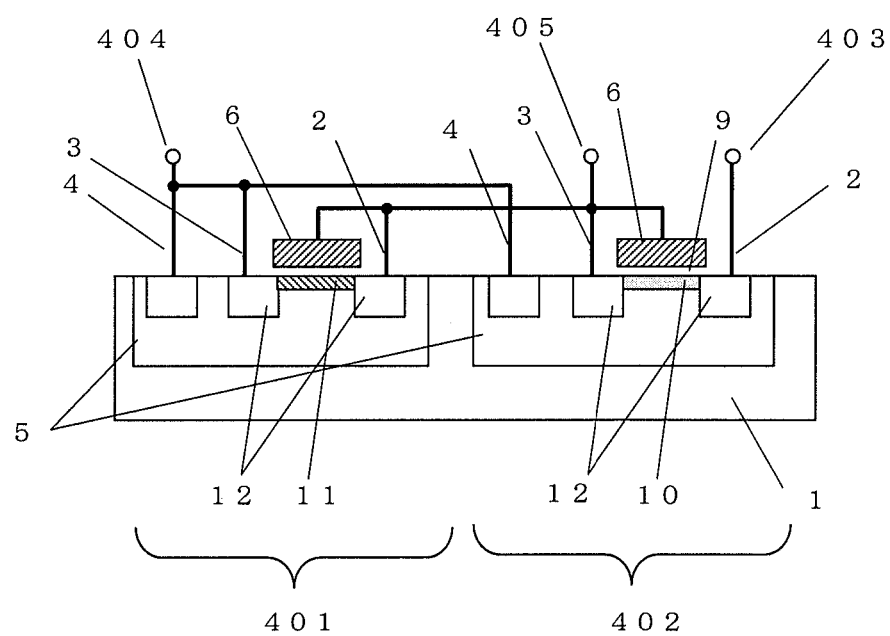
FIG. 6A is a schematic sectional view for illustrating a related-art reference voltage circuit.
Figure 6B:
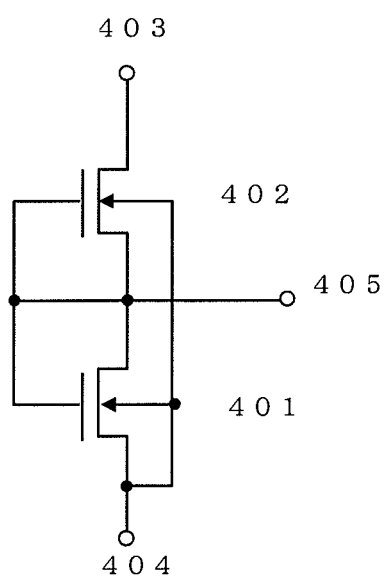
FIG. 6B is an illustration of an exemplary related-art reference voltage circuit.
Figure 8:
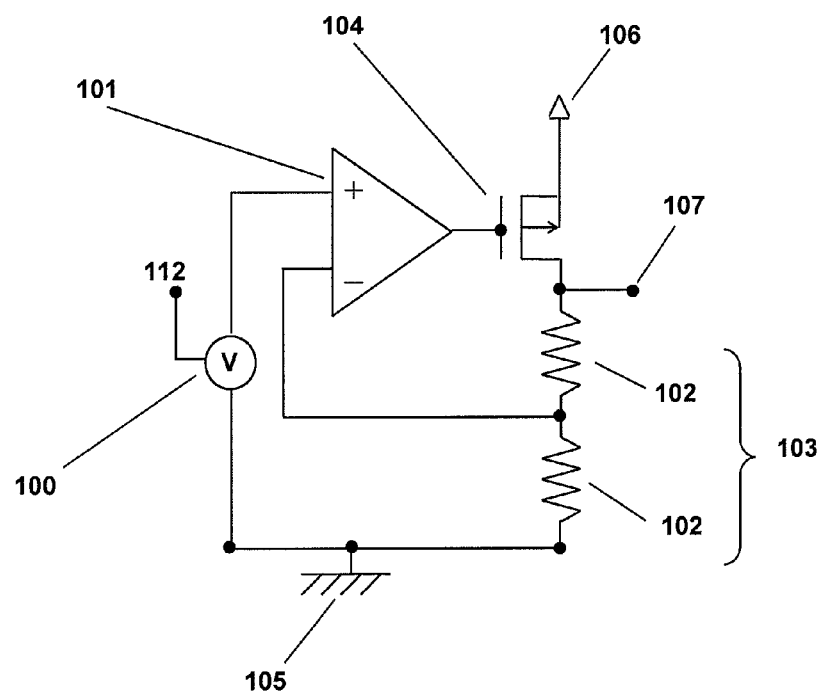
FIG. 8 is a schematic circuit diagram of a step-down series regulator of the semiconductor integrated circuit device according to the present invention.
Figure 9:
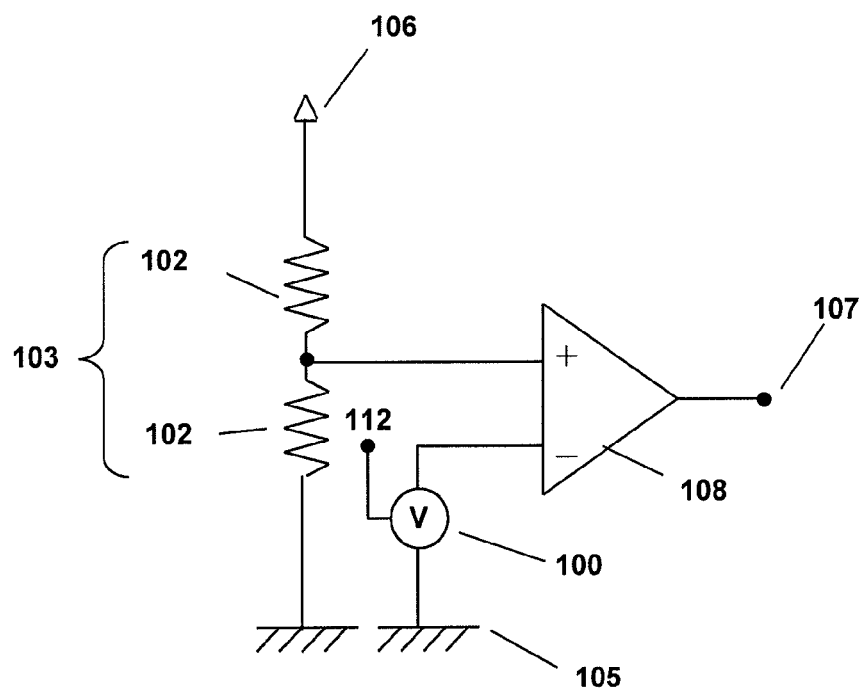
FIG. 9 is a schematic circuit diagram of a voltage detector of the semiconductor integrated circuit device according to the present invention.

First, according to the present invention, a regulating input terminal 112 to which an applied voltage/current can be input from the outside is added to the reference voltage circuits 100 of the semiconductor integrated circuits in FIG. 3 and FIG. 4 to form a step-down series regulator and a voltage detector illustrated in FIG. 8 and FIG. 9, respectively. A specific element in the reference voltage circuit is replaced by a memory element. The memory element can change a threshold voltage depending on the voltage/current input to the regulating input terminal 112 from the outside. The output voltage is regulated by a method described below with reference to FIG. 1.

Figure 1:
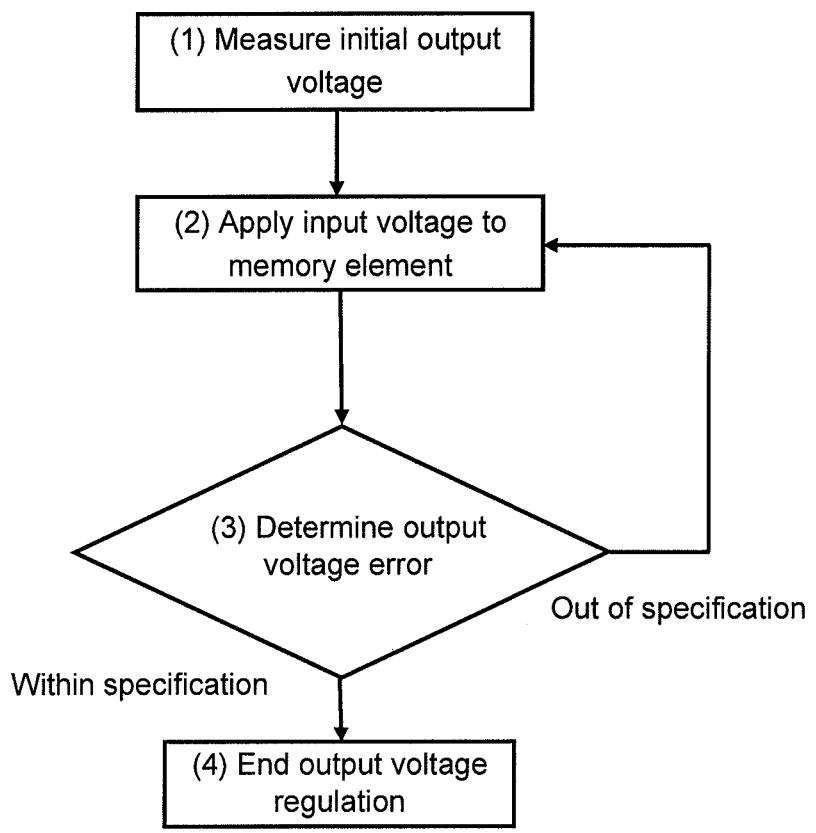
FIG. 1 is a process flow chart for illustrating a method of regulating an output voltage of a semiconductor integrated circuit device according to the present invention.

First, an output voltage of a product completed in a semiconductor processing factory is measured as it is ((1) in FIG. 1).

Then, a voltage/current is applied to the memory element in the reference voltage circuit via the regulating input terminal to change the threshold voltage of the memory element ((2) in FIG. 1). In the semiconductor integrated circuit as illustrated in FIG. 8 or FIG. 9, when the reference voltage value that is output from the reference voltage circuit changes, in accordance with Expression (1), the output voltage is also changed in proportion thereto, and thus, the amount of the voltage/current applied to the regulating input terminal and an amount of the output voltage are directly proportional.

After that, the output voltage is measured. If the output voltage is out of tolerance required for the product, the process returns to (2) in FIG. 1 to start again application of a voltage/current to the memory element. In this case, a method in which the reference voltage value of the reference voltage circuit is set in advance so that an initial output voltage value is out of specification and the voltage/current applied to the memory element is gradually changed in one direction, i.e., in a + direction or in a − direction to fit the product into specification is an easy way of regulation, and thus, is preferred.

The steps (2) and (3) in FIG. 1 are repeated, and, when the output voltage value is within specification, the series of processing ends ((4) in FIG. 1). The steps (2) and (3) in FIG. 1 can be, in reality, performed not intermittently but electrically continuously, and thus, by writing a program software and exerting automatic control, it takes only a short time to fit an out-of-specification product into specification.

Figure 2:
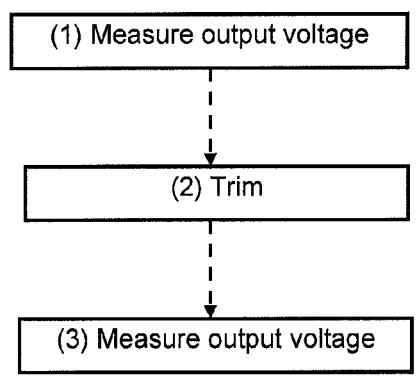
FIG. 2 is a process flow chart for illustrating a method of regulating an output voltage of a related-art semiconductor integrated circuit device.

By adopting such a method, the related-art three-step process (1) to (3) in FIG. 2 that cannot be redone can be completed in single electrical processing, which can simplify the method of regulating the output voltage and can reduce to a large extent time necessary for completing the product. Further, the method regulates the output voltage through online trimming during which the output voltage is monitored, and thus, faulty products out of specification are inhibited, and improvement in yield can be expected.

Further, influence of high heat (temperature coefficient and recrystallization of the resistors) such as in a related-art online trimming through processing of resistors with a laser can be eliminated, and thus, it is not necessary to fear an error in and reregulation of the output voltage, and a stable output voltage can be maintained.

Further, this regulating method is electrical processing that is performed irrespective of a form of the product (wafer or package), and thus, even if the form of the product changes and the characteristics fluctuate accordingly, electrical reregulation through a terminal can be performed. For example, when an output voltage of a product in a wafer state is regulated, and then, after the product is packaged, the output voltage is changed under the influence of thermal hysteresis, resin stress, or the like and the product goes out of specification, the product in a package state can be reregulated to be fit into specification. Alternatively, the output voltage may be regulated only in a final form. By omitting measurement/processing in the wafer state, the frequency of the test can be lowered and the number of the process steps can be reduced.

Further, in addition to the lowered frequency of the test described above, the need for the laser trimming step is eliminated, and thus, the effect of inhibiting investment in equipment such as the measurement apparatus and the laser apparatus is also great.

Further, the voltage dividing circuit 103 including the resistance elements 102 illustrated in FIG. 8 or FIG. 9 is not required to be highly accurate. Even if the accuracy of the voltage dividing circuit 103 is low, the method according to the present invention enables the output voltage value to be fit into specification, and thus, preparing a plurality of uniform resistance elements and consideration of a pattern layout thereof as in the related art are not necessary, and the fuses are also not necessary. Therefore, there is an advantage in that the chip size and a layout load are expected to be reduced.

Next, a reference voltage circuit for carrying out the present invention is described with reference to FIG. 7A and FIG. 7B. As illustrated in FIG. 7B, in the reference voltage circuit, the depression type NMOS transistor 402 and the enhancement type NMOS transistor 401 are connected in series between a regulating input terminal 406 and the ground terminal 404. A constant current is output from the depression type NMOS transistor 402 as a current source. A voltage generated at the drain terminal of the enhancement type NMOS transistor 401 as a load element is output as a constant voltage to the reference voltage output terminal 405.

Figure 7A:
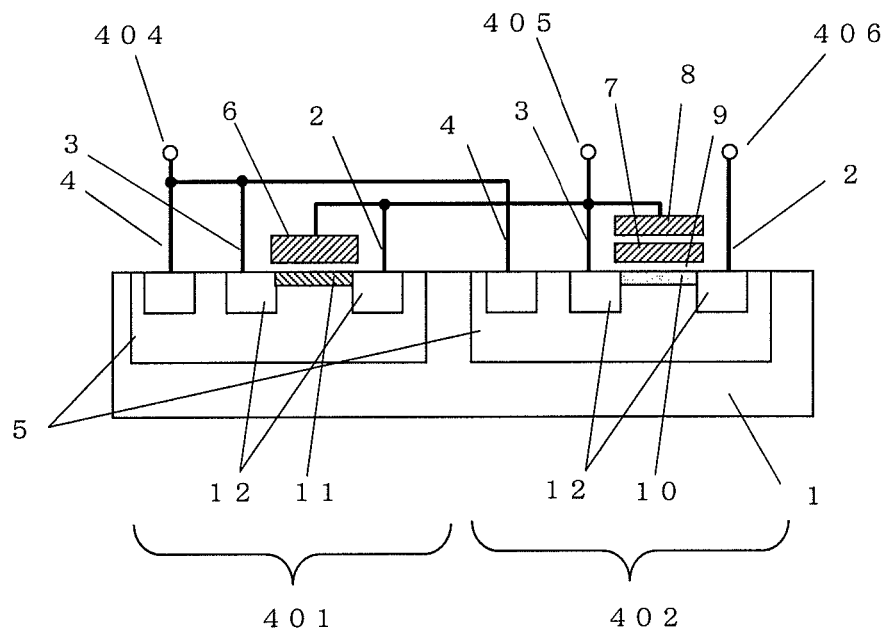
FIG. 7A is a schematic sectional view for illustrating a reference voltage circuit according to the present invention.
Figure 7B:
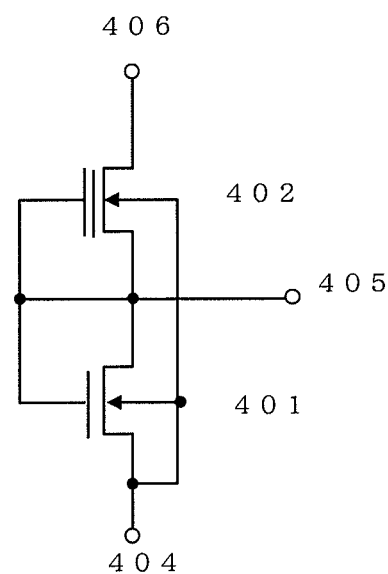
FIG. 7B is an illustration of an exemplary reference voltage circuit according to the present invention.

However, in this case, as illustrated in FIG. 7A, the depression type NMOS transistor 402 used in the present invention has a structure in which polycrystalline silicon gate electrodes are stacked, with an upper layer being a control gate electrode 8 for controlling the voltage, and a lower layer being a floating gate electrode 7 for injecting and accumulating charge.

In the exemplary circuit structure illustrated in FIG. 7B, when a voltage at the input terminal 406 rises, because a voltage between the reference voltage output terminal 405 and the ground terminal 404 is fixed at a certain value at all times, the voltage rise is borne between the regulating input terminal 406 and the reference voltage output terminal 405, a drain voltage of the depression type NMOS transistor 402 rises, and generation of hot carriers becomes conspicuous. Part of hot holes among the hot carriers generated here jump into the floating gate electrode 7 at a lower potential via the gate oxide film to charge the floating electrode on a positive side. When this is seen from the control electrode side, a threshold voltage of the depression type NMOS transistor is lowered. Then, the amount of current of the depression type NMOS transistor increases, and the potential of the reference voltage output terminal 405 becomes higher accordingly.

When the reference voltage value of the reference voltage circuit increases, in accordance with Expression (1), the output voltage of the step-down series regulator illustrated in FIG. 8 rises.

Specifically, by controlling the voltage of the reference voltage circuit input terminal, the output voltage of the step-down series regulator can be arbitrarily changed. In this case, the threshold voltage of the memory element is changed in a lower direction by voltage regulation via the regulating input terminal. In other words, the reference voltage that is output from the reference voltage circuit is changed in a higher direction, and the output voltage is changed in a higher direction accordingly, and thus, when the output voltage of the step-down series regulator according to the present invention is designed so as to have a lower value than that of specification before regulation by the regulating input terminal, by regulation of the output voltage by the regulating input terminal, a wide range of output voltage specification can be accommodated.

Further, according to this method, the output voltage can be fit into a predetermined target voltage value not via a laser trimming step but only through electrical control with high accuracy.

Similarly, by realizing the reference voltage circuit in a voltage detection circuit illustrated in FIG. 4 using a similar circuit, the output voltages of the respective semiconductor integrated circuit devices can be similarly controlled and set through voltage control of the regulating input terminal connected to the reference voltage circuit.

Further, with regard to the reference voltage circuit, it goes without saying that the present invention can be applied to any structure of a circuit insofar as the circuit basically operates with a combination of an element serving as a current source and an element serving as a load as described above.

Further, the memory element described herein uses, as a principle, charge injection into the floating gate electrode as hot carrier injection. However, carrier injection using an FN tunnel current via a gate oxide film or trapping of carriers in a level existing in an insulating film may also be used, and the memory element is meant to refer to any kind of an element with which the threshold voltage can be shifted through carrier injection.

Further, according to the present invention, the output voltage can be changed through an input electrical signal from an regulating input terminal not only in a step-down series regulator and a voltage detector as described above but in various semiconductor integrated circuit devices for power management including a reference voltage circuit having a memory terminal that can change the threshold voltage with the input electrical signal. Therefore, the output voltage can be set with high accuracy by single electrical regulation, and it is clear that the present invention is remarkably effective from the viewpoint of costs and time necessary for completing the product.

What is claimed is:

1. A semiconductor integrated circuit device comprising:
   a PMOS output element having a source electrode connected to a power supply terminal and a drain electrode connected to an output voltage terminal from which an output voltage is supplied;
   a voltage dividing circuit having resistors for dividing the supplied output voltage to produce a divided voltage;
   a reference voltage circuit for generating a reference voltage and having a memory element whose threshold voltage determines the reference voltage directly output from the reference voltage circuit, the reference voltage circuit having a regulating input terminal which is connected to the memory element and which receives an input signal proportional to a measured value of the reference voltage output from the reference voltage circuit to change the threshold voltage of the memory element to thereby change the value of the reference voltage; and
   an error amplifier to which the divided voltage and the reference voltage are supplied to generate a voltage applied to a gate electrode of the PMOS output element, the voltage being amplified depending on a difference between the divided voltage and the reference voltage.

2. A semiconductor integrated circuit device according to claim 1, wherein the memory element of the reference voltage circuit is an N-channel MOS transistor comprising a floating gate electrode and a control gate electrode.

3. A semiconductor integrated circuit device according to claim 1, wherein the memory element of the reference voltage circuit comprises an N-channel depression type MOS transistor having a floating gate a control gate electrode, and electrode; and wherein the reference voltage circuit further comprises an N-channel enhancement type MOS transistor serially connected to the memory element.

4. A semiconductor integrated circuit device comprising:
a voltage dividing circuit having resistors for dividing a power supply voltage supplied from a power supply terminal to produce a divided voltage;
a reference voltage circuit for generating a reference voltage and having a memory element whose threshold voltage determines the reference voltage directly output from the reference voltage circuit, the reference voltage circuit having a regulating input terminal which is connected to the memory element and which receives an input signal proportional to a measured value of the reference voltage output from the reference voltage circuit to change the threshold voltage of the memory element to thereby change the value of the reference voltage; and
a comparator to which the divided voltage and the reference voltage are supplied to generate a signal which corresponds to a difference between the divided voltage and the reference voltage and which is sent from an output voltage terminal.

5. A semiconductor integrated circuit device according to claim 4, wherein the memory element of the reference voltage circuit is an N-channel MOS transistor comprising a floating gate electrode and a control gate electrode.

6. A semiconductor integrated circuit device according to claim 4, wherein the memory element of the reference voltage circuit comprises an N-channel depression type MOS transistor having a floating gate electrode and a control gate electrode; and wherein the reference voltage circuit further comprises an N-channel enhancement type MOS transistor serially connected to the memory element.

* * * * *